United States Patent [19]

Delgado et al.

[11] Patent Number: 4,968,628
[45] Date of Patent: Nov. 6, 1990

[54] METHOD OF FABRICATING BACK DIFFUSED BONDED OXIDE SUBSTRATES

[75] Inventors: Jose A. Delgado, Satellite Beach; Stephen J. Gaul, Melbourne; Craig J. McLachlan, Melbourne Beach; George V. Rouse, Indialantic, all of Fla.

[73] Assignee: Harris Corporation, Melbourne, Fla.

[21] Appl. No.: 282,064

[22] Filed: Dec. 9, 1988

[51] Int. Cl.$^5$ ............................................. H01L 21/76
[52] U.S. Cl. ........................................ 437/21; 437/62; 437/67; 437/974; 148/DIG. 12
[58] Field of Search ............... 437/21, 62, 924, 974, 437/67; 148/DIG. 85, DIG. 12, DIG. 141

[56] References Cited

U.S. PATENT DOCUMENTS

| | | | |
|---|---|---|---|
| 3,689,357 | 9/1972 | Jordan | 437/62 |
| 3,865,649 | 2/1975 | Beasom | 357/42 |
| 4,309,813 | 1/1982 | Hull | 156/647 |
| 4,312,680 | 1/1982 | Hsu | 437/21 |
| 4,554,059 | 11/1985 | Short et al. | 204/129.3 |
| 4,638,552 | 1/1987 | Shimbo et al. | 437/62 |
| 4,784,970 | 11/1988 | Solomon | 437/51 |
| 4,851,078 | 7/1989 | Short et al. | 156/632 |

FOREIGN PATENT DOCUMENTS 61-139041 6/1986 Japan ..................................... 437/62

Primary Examiner—Olik Chaudhuri
Attorney, Agent, or Firm—Barnes & Thornburg

[57] ABSTRACT

A method including forming an alignment moat of a first depth on a first surface of a substrate and performing all backside processing, forming a first oxide layer on the first surface and oxide bonding it to a handling wafer by oxide bonding. The substrate is then thinned from a second surface opposite the first surface down to a thickness less than the depth of the alignment moat so the alignment moat is exposed at a third surface for front side processing.

19 Claims, 2 Drawing Sheets

METHOD OF FABRICATING BACK DIFFUSED BONDED OXIDE SUBSTRATES

BACKGROUND AND SUMMARY OF THE INVENTION

The present invention relates generally to a method of fabricating dielectrically isolated regions, and more specifically to an improved method of fabricating back diffused bonded oxide substrates having dielectrically isolated islands.

Devices in integrated circuits are formed by introducing impurities into a surface of a substrate. This requires the use of a plurality of masks to form regions of different depths and impurity concentrations. Acceptability of the finally formed devices depends upon alignment of the diffused regions. Thus, there is a great emphasis on schemes to align a mask to a substrate to assure proper alignment of the diffused regions. For junction isolated substrates, the first diffusion is from a top or front surface and consequently, all the diffusions may be aligned relative to the first diffusion. This technique may include positioning an indicia on a substrate and performing the first and subsequent diffusions using an indicia on the mask to align with the indicia on the substrate.

For devices formed in dielectrically isolated islands of the type described in U.S. Pat. No. 3,865,649 to Beasom, the dielectrically isolated islands are formed from a first surface which subsequently becomes a buried surface and the devices are formed therein by diffusion into a second surface opposite the first surface which does not exist in the initial material. Thus, no initial mark may be formed which allows alignment of the diffused device regions to the dielectric isolation. Since it is unacceptable in some applications for diffused regions of the device to touch the dielectric isolation, more care and time have to be used to align the mask relative to the dielectric isolation. Since the islands have inwardly sloping sides, the surface area available for forming the diffused regions is a function of the amount of starting material removed. Thus, the size of the islands as perceived from the surface varies considerably. At present, the diffusions are aligned to the outside of the islands. In view of the variation in the size, the alignment in a possibly increased island will not assure alignment in the remaining islands on the wafer. The varied island size also results in a varying alignment tolerance. This causes difficulty in judging alignment visually.

To solve these problems, a support material rectangular indicia is formed during the formation of the dielectric isolation of starting material islands in one of the dielectrically isolated islands as described in U.S. Pat. No. 4,309,812 to Hull. The resulting indicia appears on the front processing face during the thinning of the substrate to produce the dielectrically isolated islands. An X indicia on a mask is positioned over the four corners of the rectangular indicia to align the mask and substrate for subsequent processing. The rectangular indicia is not used for any back side processing, only front side processing since it is formed with the isolation moats.

In addition to the dielectric isolation, wherein the lateral and bottom walls are formed simultaneously, there has been a substantial growth in semiconductor-on-insulator (SOI) wafer fabrication. A thin substrate is separated from a handle wafer by an insulator layer. These structures may be formed by high dose oxygen implantation (SIMOX), bonded wafers, ZMR or full isolation by porous oxidation silicon (FIPOS) These processes generally do not include backside processing, and any buried layers are produced by epitaxial deposition of the resulting substrate over the buried layer regions.

Any backside processing generally results in uneven surfaces which are very undesirable for bonding since the valleys result in unbonded regions. These unbonded regions fall out when front side isolation dielectric trenches are formed. Presently, uneven oxide surfaces are used as alignment indicia in backside processing.

Thus, it is an object of the present invention to provide a method of fabricating a semiconductor-on-insulator integrated circuit capable of backside processing.

Another object of the present invention is to provide a semiconductor-on-insulator integrated circuit with backside processing and improved alignment.

These and other objects are achieved by forming an alignment moat of a first depth on a first surface of a substrate and performing all backside processing using the alignment moat, forming a first oxide layer on the first surface and bonding it to a handle wafer by oxide bonding. The substrate is then thinned from a second surface opposite the first surface down to a thickness less than the depth of the alignment moat so the alignment moat is exposed at a third surface. Isolation, either dielectric or junction, is then formed in the third surface extending down through the substrate to the first oxide layer. Topside processing is then conducted. While anisotropic chemical etching is used to form the alignment moat so as to provide a depth indicator, the dielectric isolation trenches are formed by reactive ion etching.

The backside processing includes diffusing impurities having an opposite conductivity type than that of the substrate to a depth at least equal to the depth of the alignment moat. Impurities to form a buried region, which are the same conductivity type as the substrate, are formed to a depth substantially less than the alignment moat depth. If a non-oxide mask is used as the last masking step in the backside processing, an additional oxide layer may be formed prior to bonding. If an oxide mask is used as the last mask in the backside processing, it must be stripped and a fresh layer of oxide must be applied to the first or back surface prior to bonding.

Other objects, advantages and novel features of the present invention will become apparent from the following detailed description of the invention when considered in conjunction with the accompanying drawings.

DETAILED DESCRIPTION OF THE DRAWINGS

Figure 1:
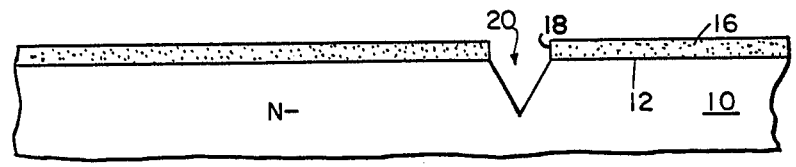
FIGS. 1-8 show cross-sectional views of a wafer during various stages of fabrication according to the principles of the present invention, with FIGS. 3a and 3b being alternative steps in that process.

A beginning substrate 10, for example having an N- impurity concentration and a thickness exceeding 5 mils, includes a first surface 12 and an opposed second surface 14. The surface 12 has a mask layer 16 applied with a mask opening 18. The substrate 10 is then etched to form an alignment moat 20. Preferably, an anisotropic etch is performed such that the depth of the alignment moat 20 which is in the range of 5 to 30 microns is defined by the size of the opening 18 in the mask layer 16. Thus, the alignment moat 20 may also act as a depth indicator to be used in subsequent processing. The mask layer 16 is preferably a silicon dioxide. The substrate at this stage is illustrated in FIG. 1.

Figure 2:
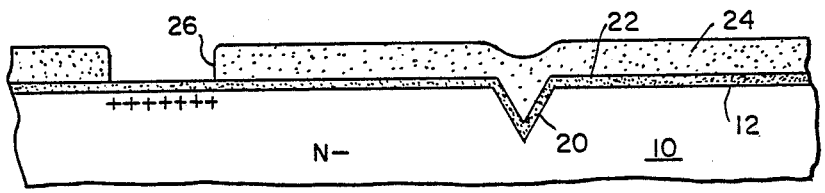
Figure 3A:
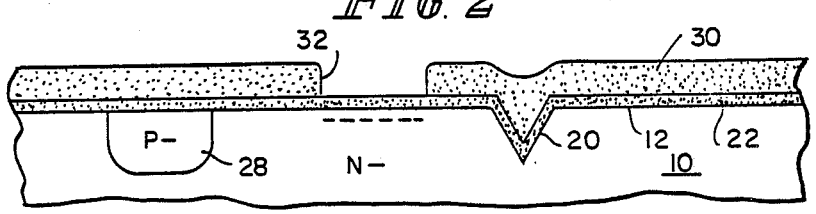
Figure 3B:
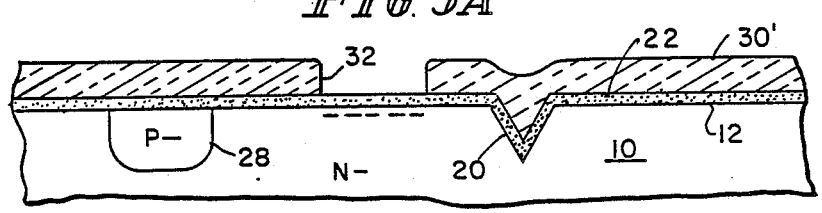

The masking layer 16 is removed and a thin layer of oxide 22 is formed on a surface 12 and in the moat 20 of the substrate 10. This thin oxide layer is in the range of approximately 1,000 angstroms. A mask layer 24 is formed therein with an aperture 26 therein using the alignment moat 20. P-type impurities, for example boron, are introduced through the aperture 26 as illustrated in FIG. 2. The mask layer 24, which may be photoresist, is removed. The wafer is then subjected to a high temperature diffusion resulting in P-region 28 which will become the P collectors, as illustrated in FIGS. 3a and 3b.

Figure 4:
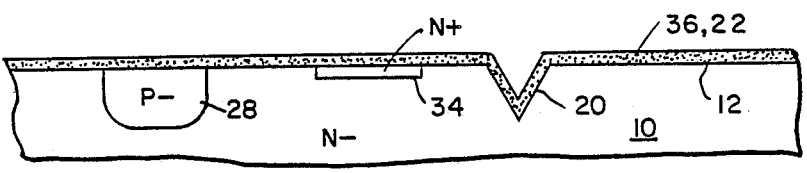

A mask layer 30 is then formed on the surface 12 with an aperture 32 therein using the alignment moat 20. N-type impurities, for example arsenic, is ion implanted to form a buried layer 34 as can be seen in FIG. 4. One method of forming the mask layer 30 is to expose the substrate to an oxidizing atmosphere or chemical vapor deposit the oxide layer, as illustrated in FIG. 3a. The original oxide 22 is shown not removed prior to forming mask layer 30, but can be stripped after the high temperature diffusion. An alternative would be to use a non-oxide mask layer 30' of materials, for example nitride or a metal such as aluminum, as illustrated in FIG. 3b. In this case the original oxide layer 22 or a new thin oxide layer must be applied prior to mask layer 30'. The ion implantation is through the thin oxide layer 22 in the aperture 32. After the ion implantation of N-type impurities, the mask layer 30, 30' is removed.

If the mask layer 30 is an oxide, the original thin oxide layer 22 and 30 are removed simultaneously. If the mask layer 30' is a non-oxide, it can be selectively removed, leaving the clean thin layer 22 on the surface 12. The thin layer 22 may then be used for the subsequent bonding steps. If the mask 30' is an oxide and layer 22 is removed, the surface 12 must have an oxide layer applied thereto by thermal or chemical vapor deposition resulting in a layer 36 as illustrated in FIG. 4. The thin layer 36, 22 is in the 10–1000 angstrom range.

Figure 5:
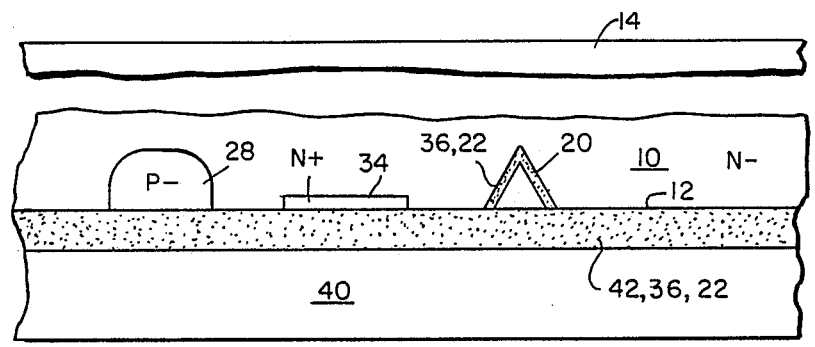

A handle wafer 40 having an oxide layer 42 thereon is then positioned on the surface 12 with its oxide layer 36, 22 contacting the oxide layer 42 of the handle wafer 40. The wafers are then taken to a high temperature, for example greater than 1000° C., and held there for more than one hour. This causes the oxide layers to bond, thereby joining the wafer 40 to the substrate 10. The resulting product is illustrated in FIG. 5. The resulting combined thickness of layers 42, 36 and 22 define the desired dielectric isolation thickness which is in the range of 1 to 4 microns. As illustrated in FIG. 5, the N-type impurities form buried region 34.

Figure 6:
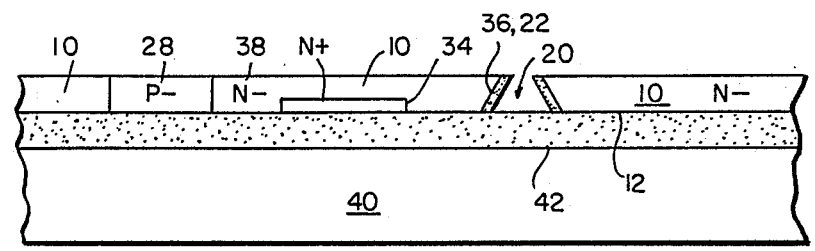

The substrate 10 is then thinned by removing materials from the surface 14 by grinding or electro-chemical etching, as described in U.S. Pat. No. 4,554,059 to Short et al., to reduce the thickness of the substrate 10 equal to or below that of the depth of the alignment moat 20. The new surface 38, as illustrated in FIG. 6, exposes the moat 20, as well as intersecting the P- region 28. The P- region 28 extends from the surface 38 to 12 as well as the moat 20 extending between surfaces 38 and 12. The N- region 34 becomes a buried layer at surface 12. The ultimate depth of region 28 with all the heat steps is in the range of 10 to 40 microns such that it exceeds the precisely developed depth of the alignment moat 20 which is in the range of 5 to 30 microns. This assures that when the thinning of the substrate 10 is performed, the region 28 extends between the surface 12 and surface 38, producing a uniform doping profile.

Figure 7:
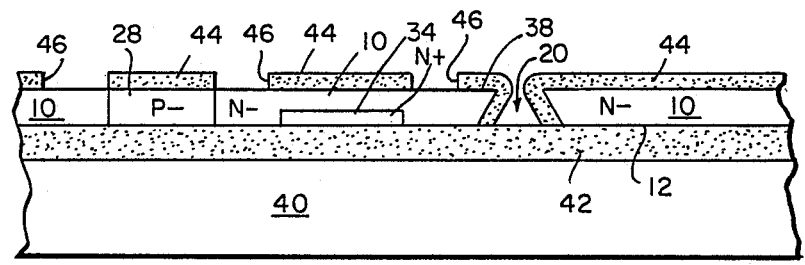

Topside processing then commences with forming a masking layer 44, for example an oxide which is patterned using photoresist, on the new top layer 38 and in the alignment moats 20. Isolation apertures 46 are formed in the mask layer 44 as illustrated in FIG. 7. Reactive ion etching is then performed to form isolation trenches 50 therein, as well as clearing the alignment moat 20. The trenches 50 and alignment 20 extend from the top surface 38 down to the bottom surface 12 and the insulative layer 42, as illustrated in FIG. 8.

Figure 8:
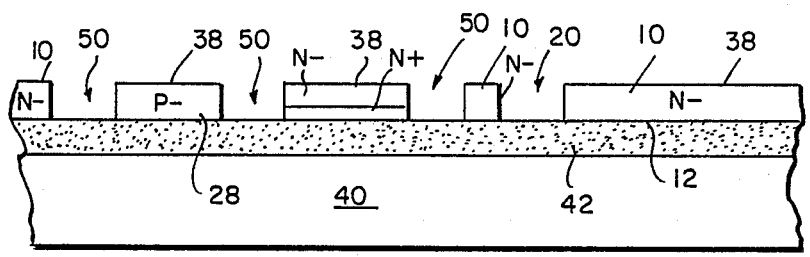

The processing of the substrate of FIG. 8 is well known, including filling the moats 50 with an insulative layer and planarizing, and subsequently forming devices in the dielectric isolated regions of substrate 10 and region 28.

Although the lateral isolation are dielectric trenches, lateral junction isolation may also be used. This may include forming P-type regions extending between surface 12 and 38 by front or back side processing.

As can be seen from the described process, a backside alignment moat furnishes backside alignment marks, depth indicator and a front to back alignment device while allowing integration of backside diffusions to a bonded wafer process.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. A method of fabricating back diffused, oxide bonded substrates comprising:
    forming an alignment moat of a first depth in a first surface of a substrate having a first conductivity type;
    introducing impurities of a second conductivity type through said first surface to form second regions using said alignment moat for alignment;
    introducing impurities of said first conductivity type through said first surface to form first regions using said alignment moat for alignment;
    positioning a handle wafer having a first oxide layer thereon on said first surface and heating to bond said substrate to said handle wafer;
    removing portions of said substrate from a second surface opposite said first surface until said substrate has a thickness less than said first depth to expose said alignment moat at a third surface; and
    subsequently performing process steps on said third surface using said alignment moat for alignment.

2. A method according to claim 1, wherein forming said alignment moat includes masking said first surface and etching exposed portions of said first surface.

3. A method according to claim 2, wherein said etching includes chemical anisotropic etching.

4. A method according to claim 1, wherein forming said alignment moat includes forming an alignment moat of said first depth in the range of 5 to 30 microns.

5. A method according to claim 1, wherein removing portions of said substrate includes grinding and etching.

6. A method according to claim 1, wherein introducing said second conductivity type impurities includes diffusing said second conductivity type impurities to form second regions of a depth of at least equal to said first depth.

7. A method according to claim 6, wherein said first depth is in the range of 10 to 40 microns.

8. A method according to claim 6, wherein said first conductivity type impurities forms first regions of a depth substantially less than said first depth.

9. A method according to claim 1, wherein:
prior to said introduction of said first conductivity type impurities, forming a second oxide layer on said first surface and forming an oxide free mask on said second oxide layer;
introducing said first conductivity type impurities through openings in said mask;
removing said mask; and
positioning said first oxide layer on said second oxide layer and heating to bond.

10. A method according to claim 1, wherein introducing said first conductivity type impurities includes:
forming a mask of oxide on said first surface,
introducing said first conductivity type impurities through openings in said mask,
removing said mask to expose said first surface, and
forming a second layer of oxide on said first surface, and said positioning includes:
positioning said first oxide layer on said second oxide layer and heating to bond.

11. A method according to claim 1, wherein said processing steps performed on said third surface includes forming isolation trenches extending from said third surface through said substrate to said first oxide layer at said first surface to form dielectrically isolated islands.

12. A method according to claim 11, wherein forming said isolation trenches includes forming a mask and reactive ion etching through openings in said mask.

13. A method according to claim 12, including filling said isolation trenches with an insulator and planarizing.

14. A method according to claim 11, wherein said process steps performed on said third surface include introducing impurities into said substrate and said second regions.

15. A method according to claim 1, wherein said process steps performed on said third surface include introducing impurities into said substrate and said second regions.

16. A method according to claim 1, wherein said alignment moat has a void at said first surface at said positioning step.

17. A method according to claim 1 wherein forming said alignment moat includes chemical anisotropic etching; and
wherein said processing steps performed on said third surface includes forming isolation trenches extending from said third surface through said substrate to said first oxide layer at said first surface to form dielectrically isolated islands.

18. A method according to claim 17 wherein forming said isolation trenches includes forming a mask and reactive ion etching through openings in said mask, said alignment moat being within one of said mask openings.

19. A method according to claim 18 including filling said isolation trenches with an insulator and planarizing.

* * * * *